(12) United States Patent
Chang et al.

(10) Patent No.: US 8,586,455 B1
(45) Date of Patent: Nov. 19, 2013

(54) PREVENTING SHORTING OF ADJACENT DEVICES

(75) Inventors: Josephine Chang, Bedford Hills, NY (US); Michael A. Guillorn, Yorktown Hieghts, NY (US); Balasubramanian Pranatharthiharan, Watervliet, NY (US); Jeffrey William Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/471,487

(22) Filed: May 15, 2012

(51) Int. Cl.
*H01L 21/20* (2006.01)
*H01L 21/36* (2006.01)

(52) U.S. Cl.
USPC .................................. 438/481; 257/E21.545

(58) Field of Classification Search
USPC ........................... 438/424, 481; 257/E21.545
See application file for complete search history.

(56) References Cited

U.S. PATENT DOCUMENTS

| | | | |
|---|---|---|---|
| 5,336,916 A | 8/1994 | Chan et al. | |
| 6,974,983 B1 | 12/2005 | Hill et al. | |
| 7,491,988 B2 | 2/2009 | Tolchinsky et al. | |
| 7,910,418 B2 | 3/2011 | Anderson et al. | |
| 7,977,798 B2 | 7/2011 | Dertinger et al. | |
| 2005/0001273 A1 | 1/2005 | Bryant et al. | |
| 2007/0013266 A1* | 1/2007 | Chang et al. | 310/311 |
| 2008/0017314 A1* | 1/2008 | Huang et al. | 156/345.24 |
| 2009/0032859 A1* | 2/2009 | Zhu | 257/316 |
| 2011/0120393 A1* | 5/2011 | Cole et al. | 122/235.12 |
| 2011/0169061 A1* | 7/2011 | Sukekawa et al. | 257/296 |
| 2011/0193175 A1* | 8/2011 | Huang et al. | 257/386 |
| 2011/0210393 A1* | 9/2011 | Chen et al. | 257/347 |

\* cited by examiner

*Primary Examiner* — William D Coleman
*Assistant Examiner* — Christine Enad
(74) *Attorney, Agent, or Firm* — Yuanmin Cai

(57) ABSTRACT

Embodiments of the present invention provide a method of preventing electrical shorting of adjacent semiconductor devices. The method includes forming a plurality of fins of a plurality of field-effect-transistors on a substrate; forming at least one barrier structure between a first and a second fin of the plurality of fins; and growing an epitaxial film from the plurality of fins, the epitaxial film extending horizontally from sidewalls of at least the first and second fins and reaching the barrier structure situating between the first and second fins.

20 Claims, 11 Drawing Sheets

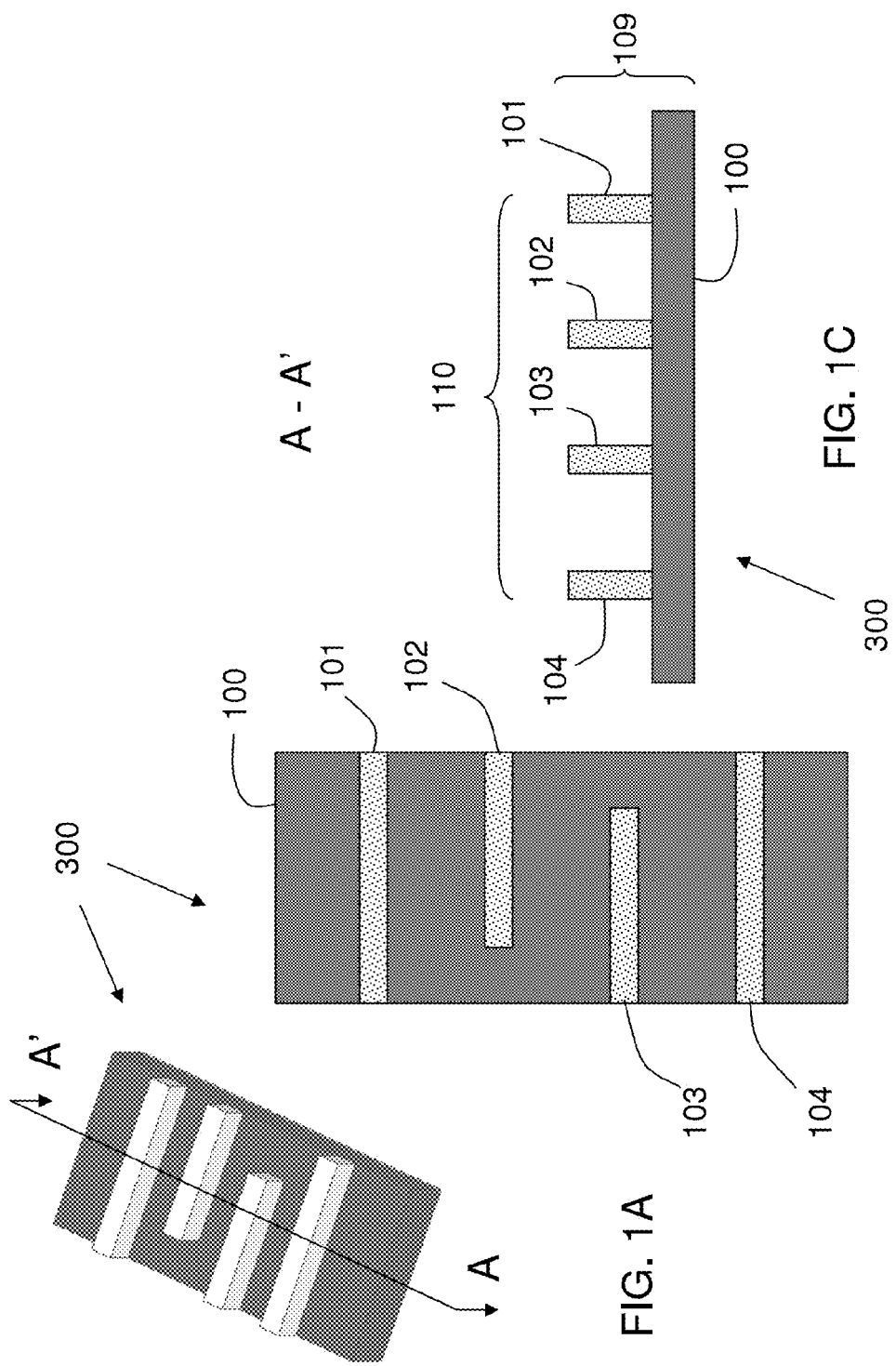

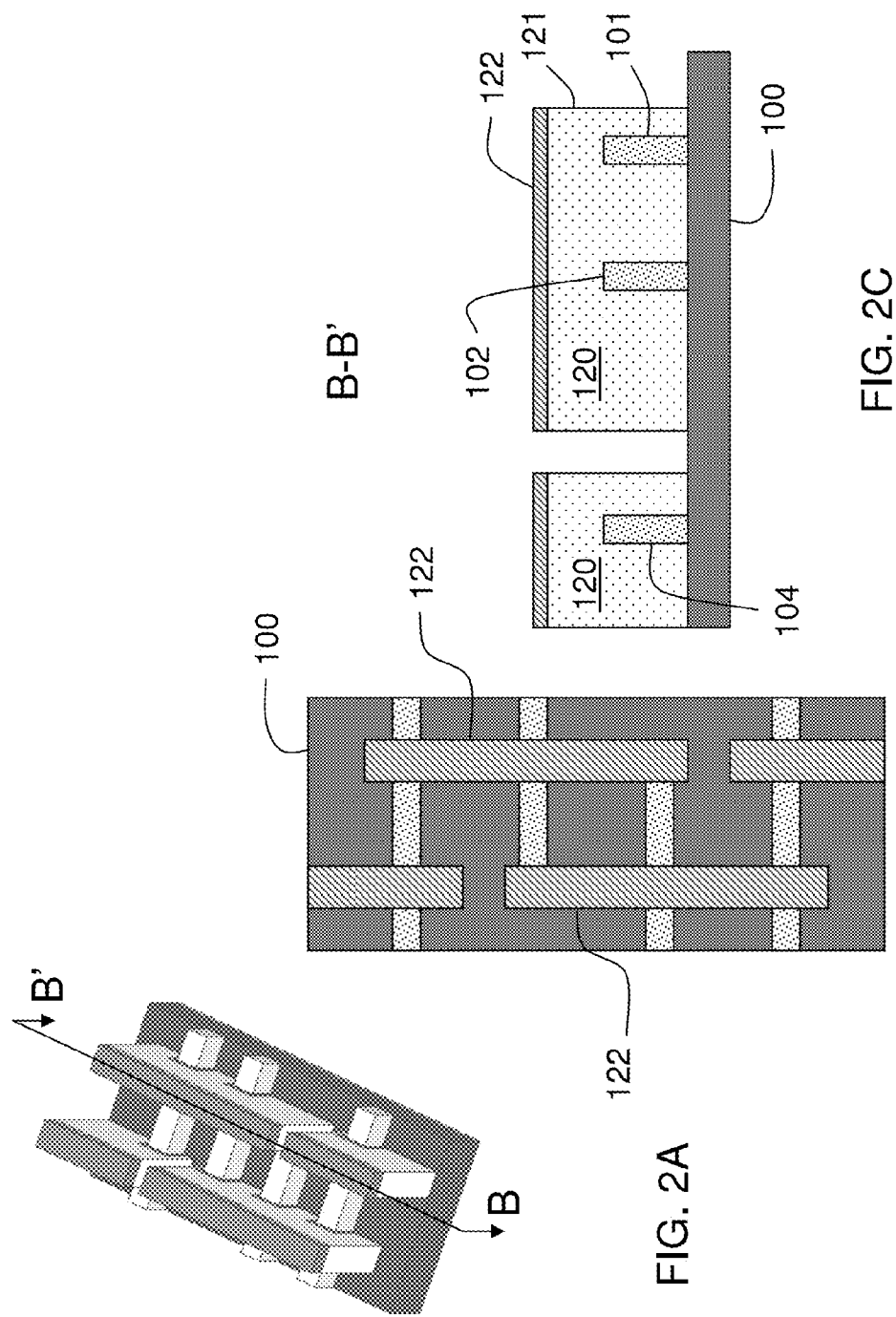

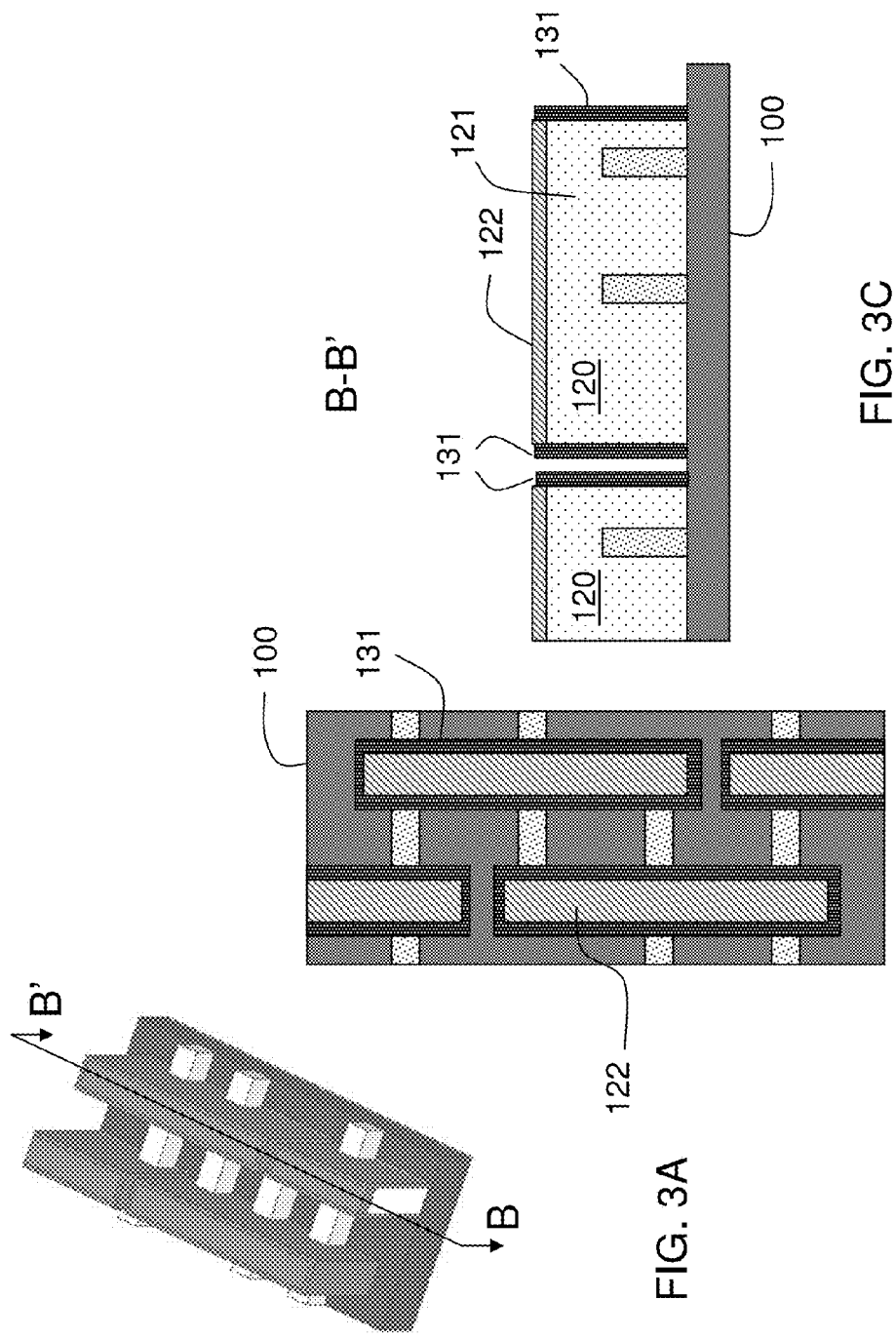

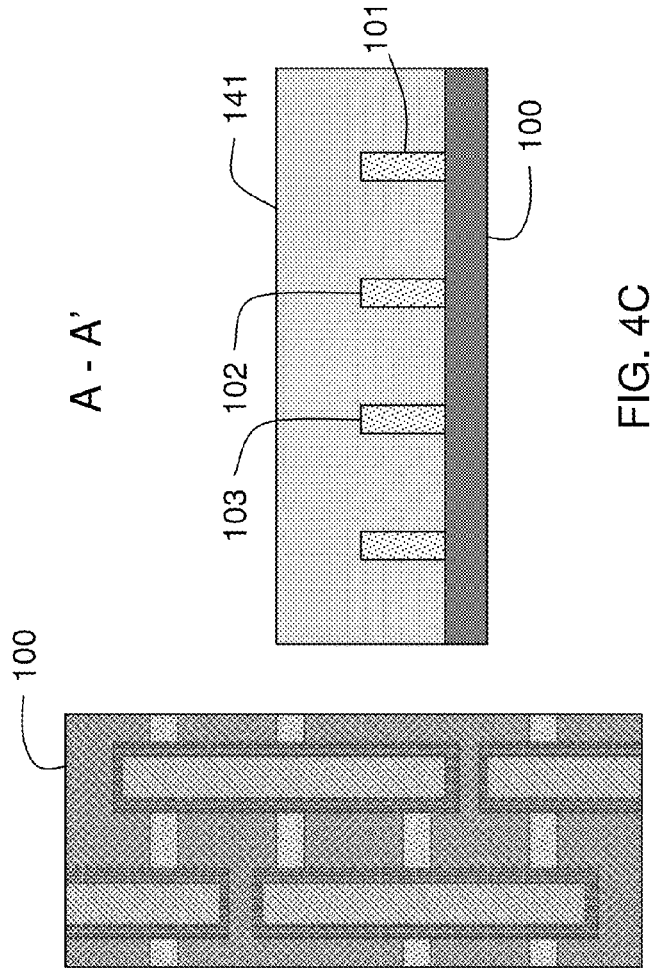
FIG. 4C
FIG. 4B
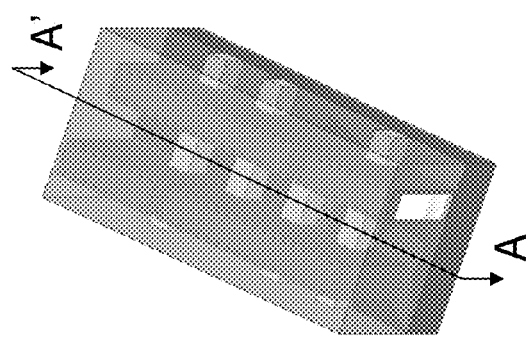
FIG. 4A

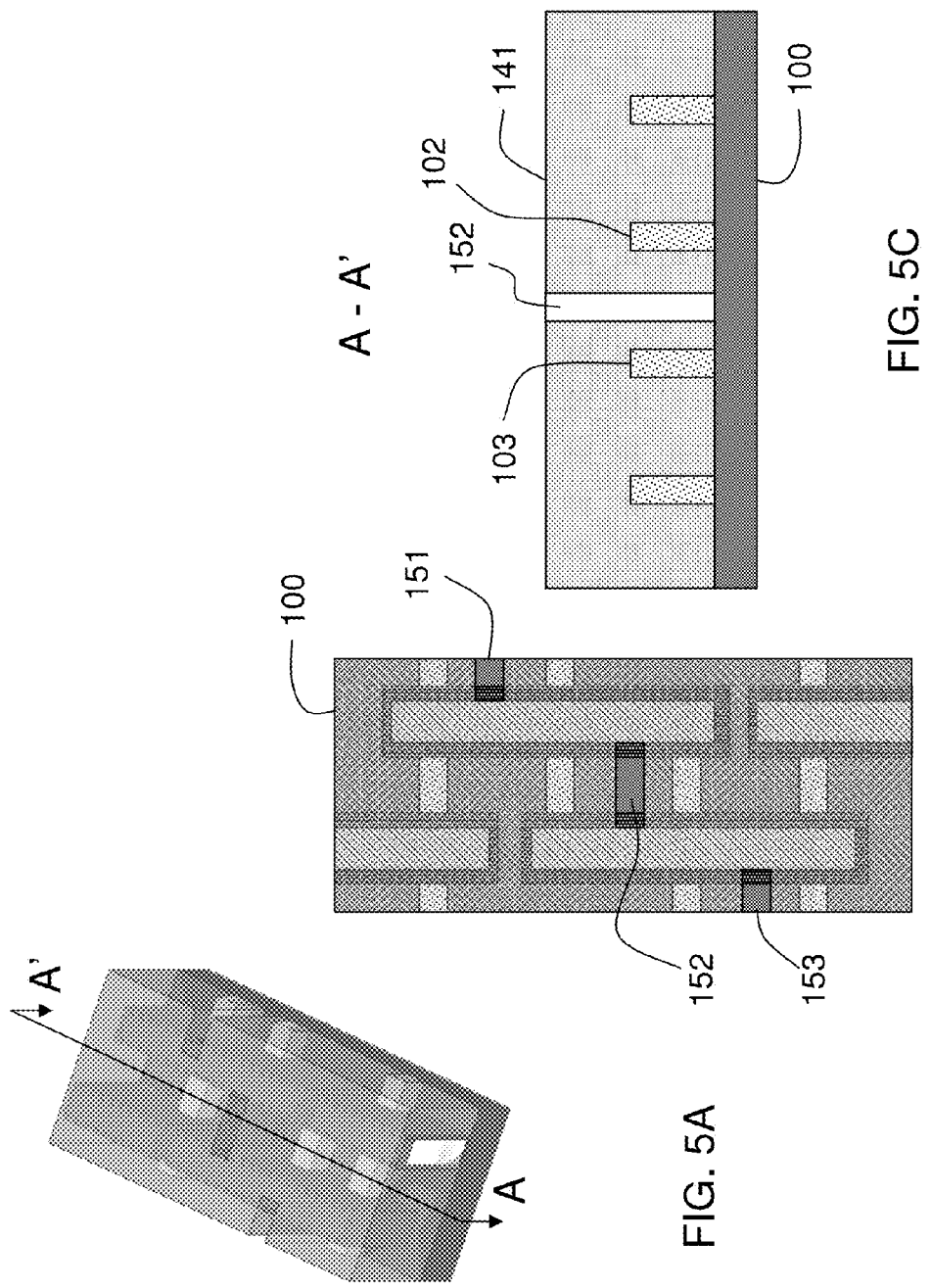

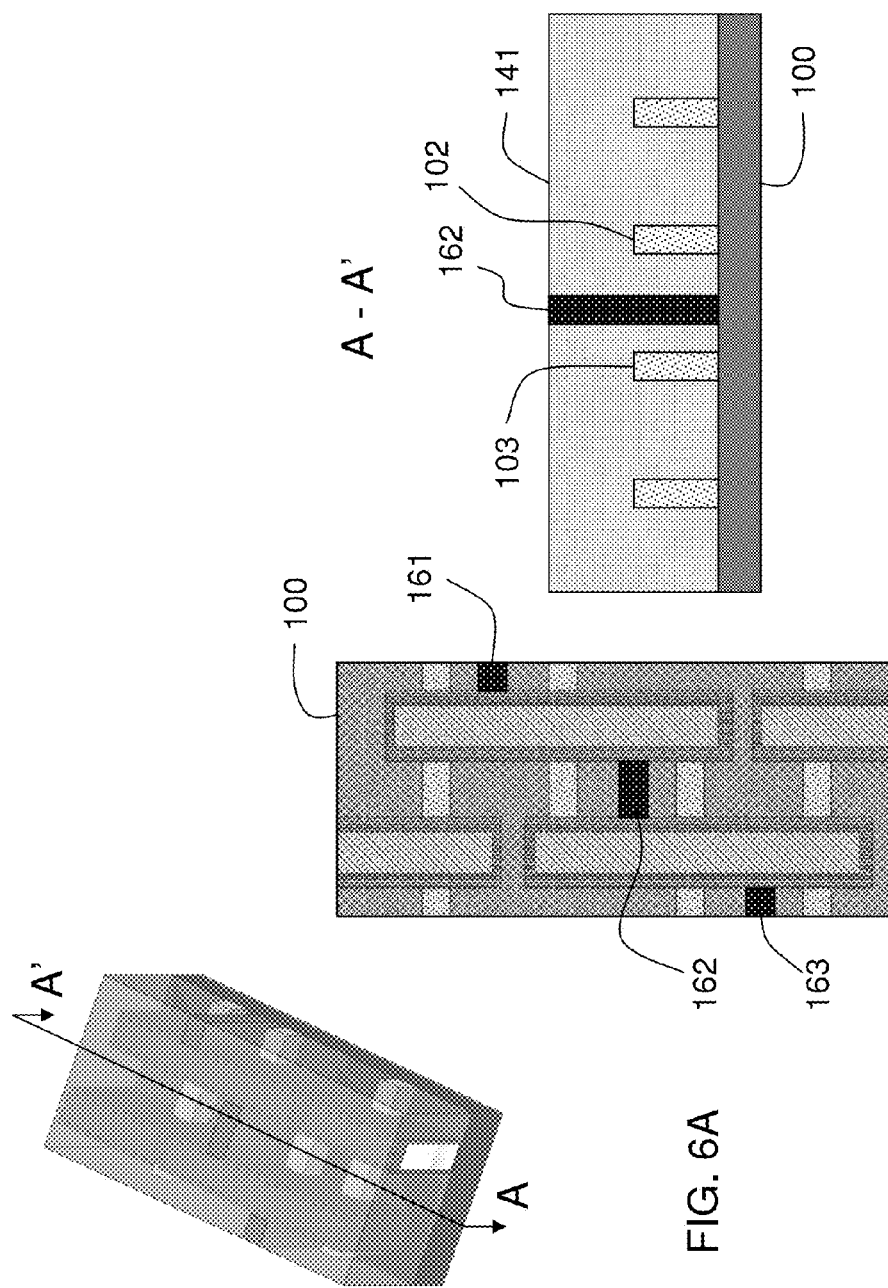

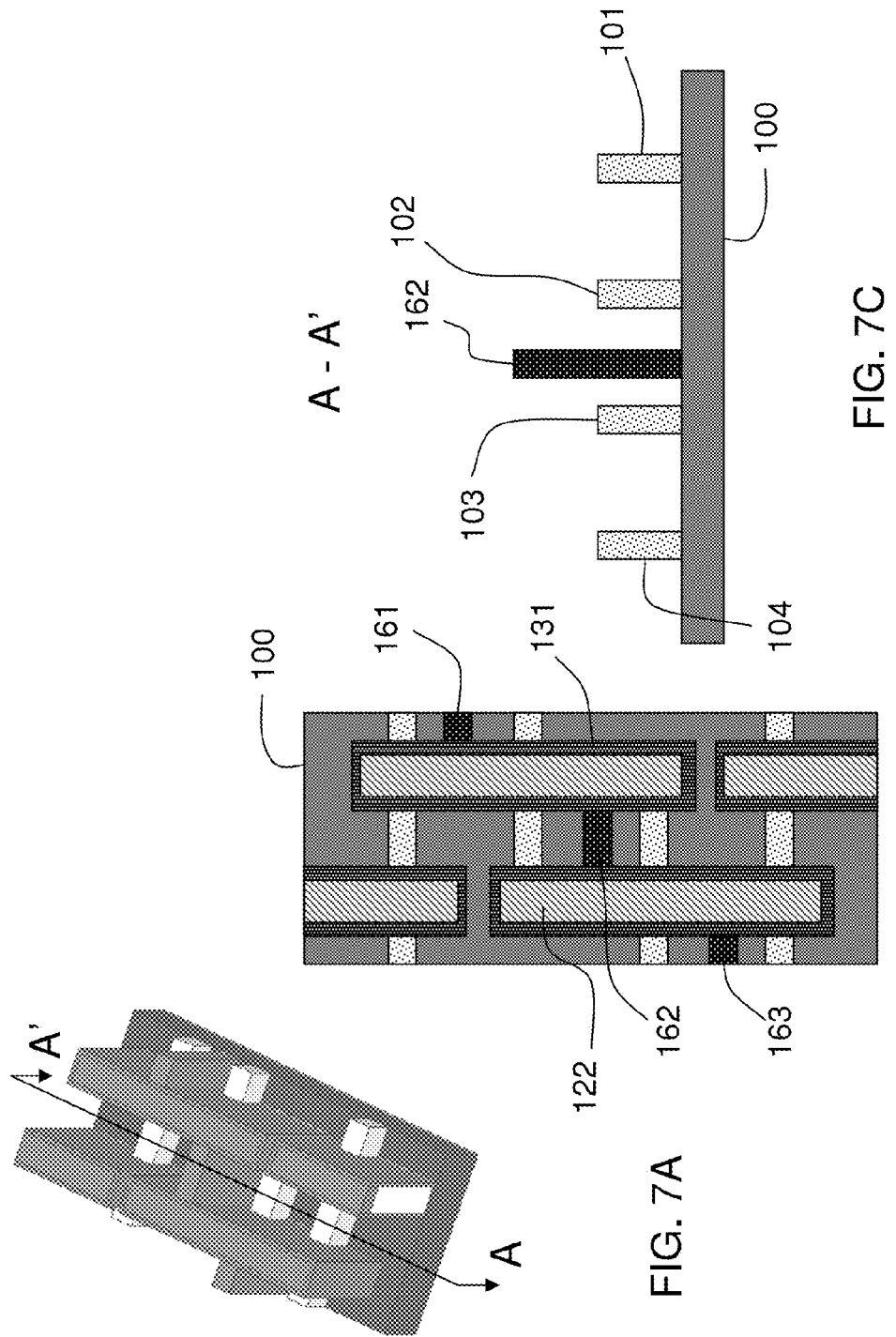

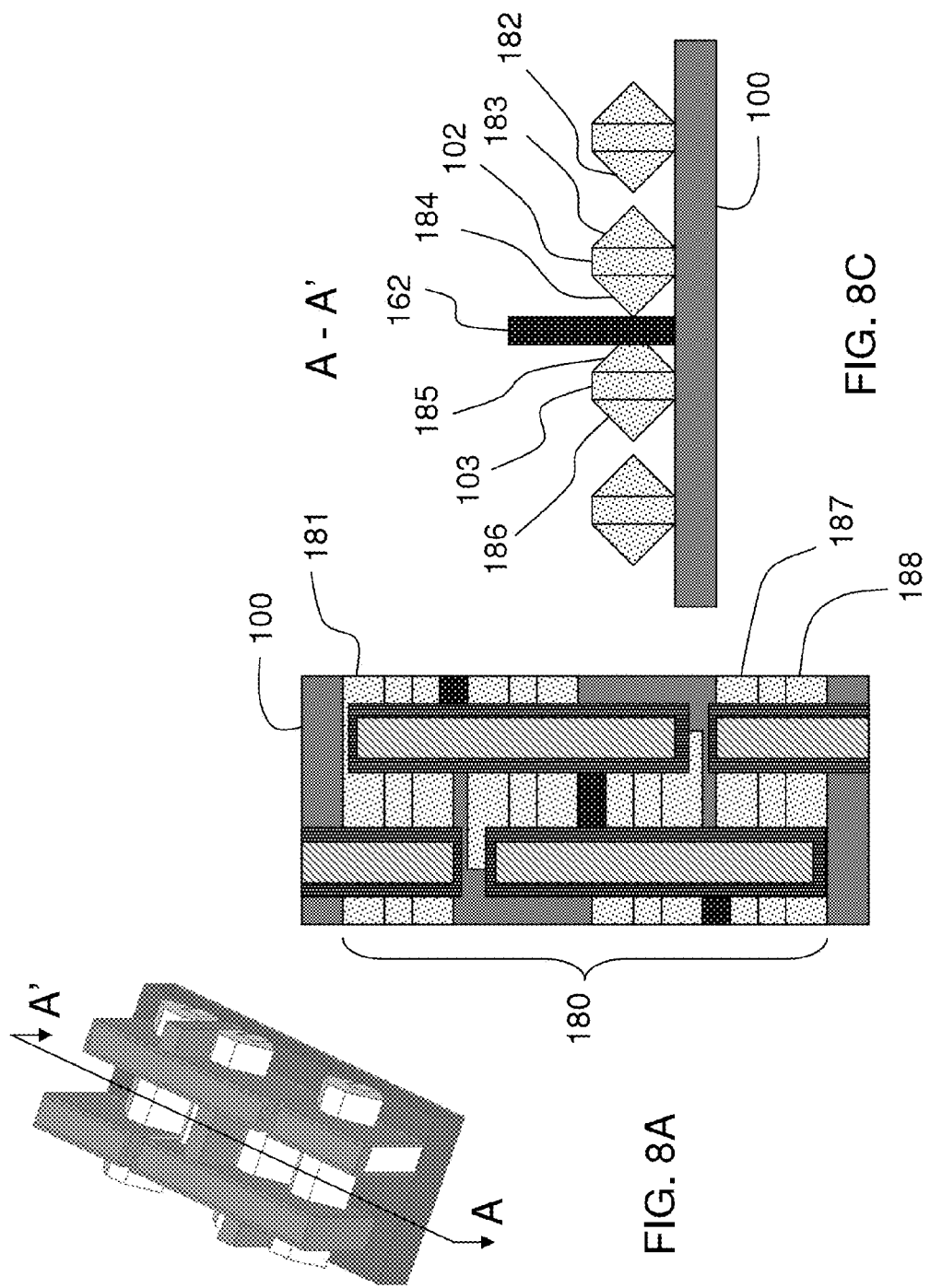

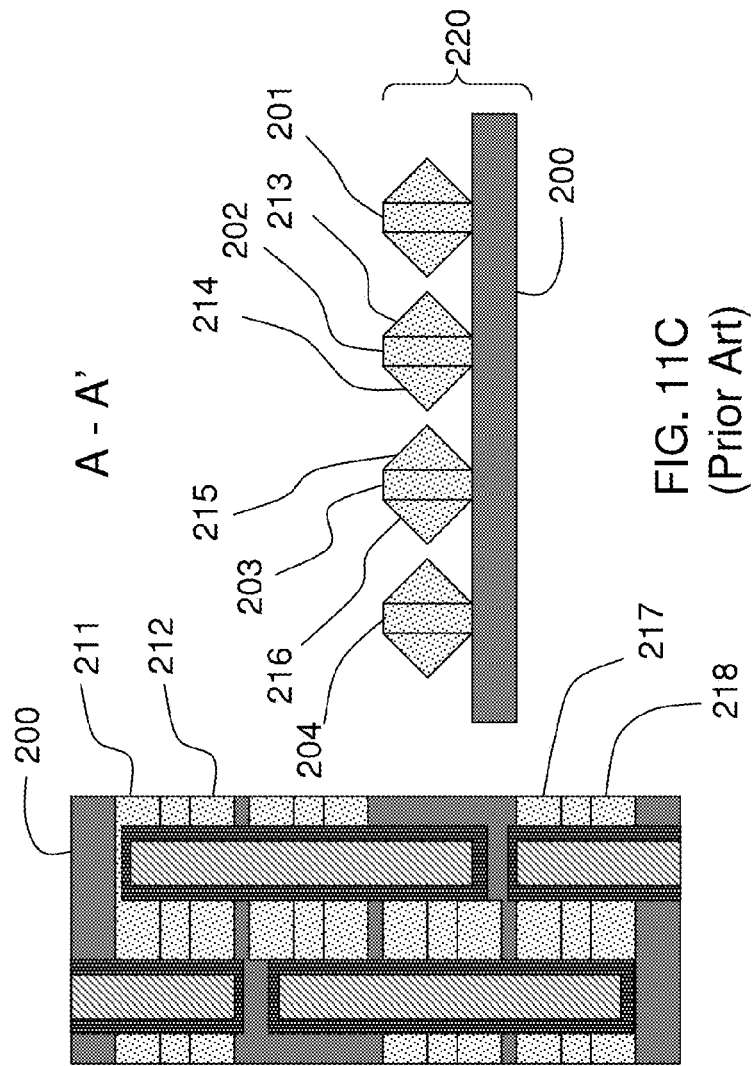
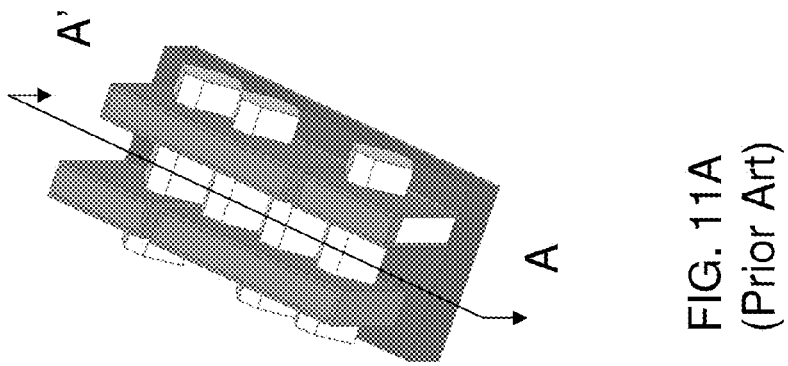
FIG. 11A (Prior Art)
FIG. 11B (Prior Art)
FIG. 11C (Prior Art)

US 8,586,455 B1

PREVENTING SHORTING OF ADJACENT DEVICES

FIELD OF THE INVENTION

The present invention relates generally to the field of semiconductor device manufacturing, and in particular relates to method of preventing shorting of adjacent semiconductor devices and device structures formed thereby.

BACKGROUND

With the continuing scaling down in real estate for semiconductor device manufacturing, non-planar semiconductor devices are expected to play an ever increasing important role in the areas of field-effect-transistor (FET) beyond certain node size, such as beyond 22 nm node, for at least one simple reason: these devices demand less real estate for manufacturing. There are many different types of non-planar semiconductor devices including for example tri-gate devices, such as tri-gate static-random-access-memory (SRAM), and fin-type FET (FinFET). FinFET transistors may include a p-type dopant doped FinFET (or PFET in short) and an n-type dopant doped FinFET (or NFET in short).

During manufacturing of non-planar devices as well as other types of devices, silicon-based epitaxial film is often used to form access to these devices as a means to lower access resistance. Silicon-based epitaxial film may be used in forming conductive regions as well, where desirable dopants may be incorporated into the epitaxially grown film through, for example, in-situ doping. On the other hand, borderless contacts to the devices may be favored and/or desirable beyond the 22 nm node as overlay tolerances shrink due to continued feature pitch scaling. Silicon-based epitaxial film growth, through forming doped regions, may form a borderless contact to the source and drain of a non-planar FET device.

Generally, silicon-based epitaxial film grows both vertically and laterally on FinFET devices due to the exposed sidewall facet of the fins. For example, for demonstrative purpose, FIGS. 11A-11C are simplified illustrations of perspective, top, and cross-sectional views respectively of a semiconductor structure in a process of manufacturing thereof as is known in the art. More specifically, a plurality of fins such as fins 201, 202, 203, and 204 are formed from a silicon-on-insulator (SOI) substrate 220. During manufacturing, a silicon-based epitaxial film may be formed. Growth of the epitaxial film is selective to silicon material. In other words, the film will grow only on top of silicon material and not on other material such as, for example, silicon-oxide ($SiO_2$) or silicon-nitride (SiN). More specifically, the epitaxial film will not grow on top of oxide layer 200 of SOI substrate 220. The epitaxial film may grow from sidewall surfaces of fins 201-204 and the growth direction may depend upon the exposed facets of the fins. For the example being illustrated in FIG. 11, films 211 and 212 may grow from sidewalls of fin 201; films 213 and 214 may grow from sidewalls of fin 202; films 215 and 216 may grow from sidewalls of fin 203; and films 217 and 218 may grow from sidewalls of fin 204. As is demonstratively illustrated in FIG. 11C, with the lateral epitaxial growth, films 214 and 215, for example, may eventually grow sufficiently big to become in contact with each other, causing shorting of fin 202 with fin 203.

Conventionally, in order to avoid shorting of neighboring fins due to lateral growth of silicon-based epitaxial film, the distance, or pitch, between neighboring fins have to be intentionally increased. However, in high density SRAM cells where spacing between fins of n-type FinFET and p-type FinFET is a dominant factor in determining cell density, the thickness of epitaxial RSD (raised source/drain) may ultimately limit the density of the cell or preclude the use of epitaxial film as a borderless contact.

SUMMARY

Embodiments of the present invention provide a method of preventing electrical shorting of adjacent semiconductor devices. According to one embodiment, the method includes forming a plurality of fins of a plurality of field-effect-transistors on a substrate; forming at least one barrier structure between a first and a second fin of the plurality of fins; and growing an epitaxial film from the plurality of fins, the epitaxial film extending horizontally from sidewalls of at least the first and second fins and the barrier structure preventing the first and second fins from contacting each other through the epitaxial film.

In one embodiment, forming the at least one barrier structure includes forming a sacrificial layer covering the plurality of fins; creating an opening in the sacrificial layer, the opening situating between the first fin and the second fin and exposing the substrate whereupon the first and second fins are formed; and filling the opening with a dielectric material.

In one embodiment, the sacrificial layer includes a carbon-based material that is compatible with high temperature processing process, the carbon-based material is either amorphous carbon or amorphous carbon-nitride. In another embodiment, the sacrificial layer includes polyimide.

According to one embodiment, filling the opening includes depositing silicon-nitride in the opening through an atomic layer deposition (ALD) process performed at around 500 degree C., or depositing hafnium-oxide in the opening through the ALD process at round 250 to 400 degree C., or depositing aluminum-oxide in the opening.

According to one embodiment, the method further includes, before growing the epitaxial film, removing the sacrificial layer thereby exposing the plurality of fins underneath thereof and the barrier structure; and pre-cleaning the plurality of fins to remove contaminants and strange objects.

According to another embodiment, the method further includes depositing a dielectric layer covering the epitaxial film and the barrier structure; and creating conductive contacts, the contacts contacting at least one of the epitaxial film and the plurality of fins, through the dielectric layer.

In one embodiment, the substrate is a silicon-on-insulator (SOI) substrate having a silicon layer on top of an oxide layer, and wherein forming the plurality of fins includes etching the silicon layer into the plurality of fins situating on top of the oxide layer.

BRIEF DESCRIPTION OF THE DRAWINGS

The present invention will be understood and appreciated more fully from the following detailed description of preferred embodiments, taken in conjunction with the accompanying drawings of which:

FIGS. 1A-1C are demonstrative illustrations of perspective, top, and cross-sectional views of a semiconductor structure during a process of manufacturing thereof according to an embodiment of the present invention;

FIGS. 2A-2C are demonstrative illustrations of perspective, top, and cross-sectional views of a semiconductor structure during a process of manufacturing thereof, following the steps shown in FIG. 1, according to an embodiment of the present invention;

FIGS. 3A-3C are demonstrative illustrations of perspective, top, and cross-sectional views of a semiconductor structure during a process of manufacturing thereof, following the steps shown in FIG. 2, according to an embodiment of the present invention;

FIGS. 4A-4C are demonstrative illustrations of perspective, top, and cross-sectional views of a semiconductor structure during a process of manufacturing thereof, following the steps shown in FIG. 3, according to an embodiment of the present invention;

FIGS. 5A-5C are demonstrative illustrations of perspective, top, and cross-sectional views of a semiconductor structure during a process of manufacturing thereof, following the steps shown in FIG. 4, according to an embodiment of the present invention;

FIGS. 6A-6C are demonstrative illustrations of perspective, top, and cross-sectional views of a semiconductor structure during a process of manufacturing thereof, following the steps shown in FIG. 5, according to an embodiment of the present invention;

FIGS. 7A-7C are demonstrative illustrations of perspective, top, and cross-sectional views of a semiconductor structure during a process of manufacturing thereof, following the steps shown in FIG. 6, according to an embodiment of the present invention;

FIGS. 8A-8C are demonstrative illustrations of perspective, top, and cross-sectional views of a semiconductor structure during a process of manufacturing thereof, following the steps shown in FIG. 7, according to an embodiment of the present invention;

FIGS. 11A-11C are demonstrative illustrations of perspective, top, and cross-sectional views of a semiconductor structure during a process of manufacturing thereof as is known in the art.

Figure 9C:
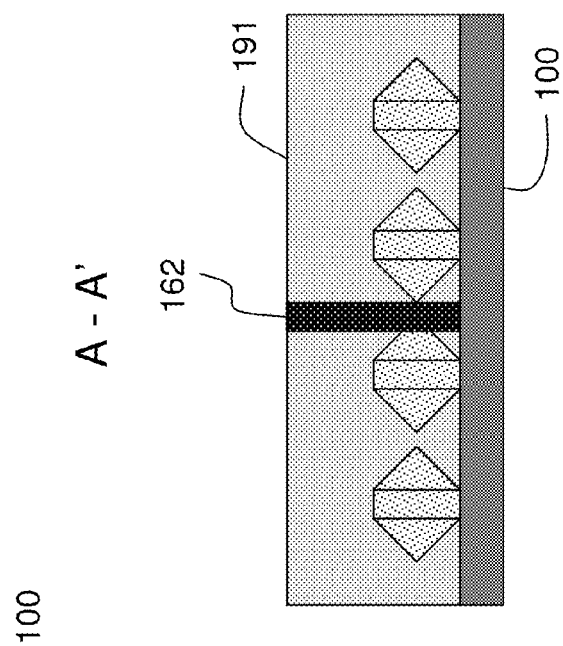
FIGS. 9A-9C are demonstrative illustrations of perspective, top, and cross-sectional views of a semiconductor structure during a process of manufacturing thereof, following the steps shown in FIG. 8, according to an embodiment of the present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

Embodiments of the present invention disclose a manufacturing process that provides limit in the lateral silicon epitaxial growth during manufacturing of FinFET devices and/or other tri-gate devices such as tri-gate SRAM cells. In one embodiment, for example, a growth stopper (or stopper) that serves stopping lateral epitaxial growth ("epi-growth") may be introduced between neighboring devices and in particular between n-type FinFET (NFET) and p-type FinFET (PFET). Further in one embodiment, the lateral epi-growth stopper may be made of a special barrier film such as a high temperature compatible carbon based film, which may be patterned through any conventional photo-lithographic processes and reactive-ion-etching (RIE) technique. In one embodiment, the barrier film forming the epi-growth stopper may be deposited, for example, through an atomic layer deposition (ALD) technique or through a chemical vapor deposition (CVD) technique. According to one embodiment, patterning of the barrier film may be performed without compromising the integrity of underlying semiconductor devices.

More specifically, FIGS. 1A-1C are demonstrative illustrations of perspective, top, and cross-sectional views respectively of a semiconductor structure during a process of manufacturing thereof according to an embodiment of the present invention. In the below detailed description of embodiment, references may be made only to the top and cross-sectional views (FIG. 1B, FIG. 1C) of the structure, and the perspective view of FIG. 1A of the semiconductor structure is provided mainly for the purpose of better understanding and clearer comprehension of present invention. For the same intended purpose, other figures throughout this application may also include perspective views of the semiconductor structure. Hereinafter, FIGS. 1A-1C may collectively be referred to as FIG. 1, and similar references may be made to other figures.

Embodiment of present invention provides a method of manufacturing semiconductor structure 300 as being illustrated in FIG. 1. Semiconductor structure 300 may be, for example, a semiconductor chip, a semiconductor wafer, or a part thereof. Embodiment of the method may start with providing a semiconductor substrate 109, which may be a bulk silicon substrate, a doped silicon substrate, or a silicon-on-insulator (SOI) substrate. Other types of substrates of different materials may be provided as well as possible candidate substrate. When a bulk silicon substrate is used, for example, the substrate is normally passivated with a dielectric film in order to provide isolation between fins of transistors to be formed thereupon. The passivating layer is generally formed after fin formation from the bulk silicon wafer. Further for example, when a SOI substrate is used, which is assumed here for description and illustration purpose of present invention without loosing generality, the substrate is inherently covered by a buried oxide layer, commonly known as a BOX layer, while the fins may be formed from the top SOI layer of the SOI substrate. In fact, the fins may be remnants of a patterned SOI layer.

In FIGS. 1A-1C, it is assumed that substrate 109 is a SOI substrate having a silicon layer on top of an oxide layer 100. Embodiment of present invention includes forming a plurality of SOI fins, for example fins 101, 102, 103, and 104 as being illustrated in FIG. 1B and FIG. 1C, on top of oxide layer 100. The formation of fins 101-104 may be made through a standard lithographic patterning process followed by an etching process such as a reactive-ion-etching (RIE) process. Depending upon the processes and material used in the processes, fins 101-104 may be made of pure silicon, doped silicon, or other suitable semiconductor materials which is part of the SOI layer on top of oxide layer 100. FIG. 1B is a top view of semiconductor structure 300 with fins 101-104 situated on top of oxide layer 100. In FIG. 1B, it is illustrated that fins 102 and 103 may have different lengths from fins 101 and 104, and fin 102 may be placed strategically different from fin 103. FIG. 1C is a cross-sectional view of semiconductor structure 300 taken at a cross-section A-A' as illustrated in FIG. 1A. Cross-section A-A' crosses all four fins 101-104, which may be collectively referred to hereinafter as fin 110. It is to be noted here that a person skilled in the art will appreciate that embodiments of the present invention are not limited to the above aspects. For example, more or less number of fins may be formed on top of oxide layer 100.

FIGS. 2A-2C are demonstrative illustrations of perspective, top, and cross-sectional views respectively of a semiconductor structure during a process of manufacturing thereof, following the steps shown in FIG. 1, according to an embodiment of the present invention. Following the formation of fins 101-104, one or more gate stacks 120 may be formed that cover across one or more fins. Gate stacks 120 may include a thin gate dielectric layer (not shown) which is formed directly on top of the fins. The gate dielectric layer may be made of silicon dioxide ($SiO_2$), hafnium-oxide (HfO), hafnium-silicon-nitride-oxide ($HfSiO_xN_y$), or other suitable material. On top of the dielectric layer, a gate electrode 121 made of one or more conductive materials may be formed. In general, gate stacks 120 may be manufactured or formed through, for example, processes such as deposition, lithographic patterning, etching, and other currently existing and/or future developed processes. During manufacturing, a hard mask 122 may be used in patterning gate stacks 120, which may be left on top of gate stacks 120 after the patterning. Hard mask 122 may be made of dielectric material such as silicon-nitride ($Si_3N_4$). FIG. 2C is a cross-sectional view of semiconductor structure 300 taken at cross-section B-B' as being illustrated in FIG. 2A. Taking as an example and to be different from cross-section A-A' as in FIG. 1C, cross-section B-B' crosses fins 101, 102, and 104 as is illustrated in FIG. 2C, and is partially over fin 103 as is illustrated in FIG. 2B. On the other hand, FIG. 2C illustrates that two separate gate stacks 120 are formed with one crossing fins 101 and 102 and another one crossing fin 104.

FIGS. 3A-3C are demonstrative illustrations of perspective, top, and cross-sectional views respectively of a semiconductor structure during a process of manufacturing thereof, following the steps shown in FIG. 2, according to an embodiment of the present invention. Following the formation of gate stacks 120, spacers 131 may be formed around gate stacks 120. The formation of spacers 131 may be made through, for example, depositing a layer of spacer material or spacer-suitable material such as dielectric material, blanket-covering oxide layer 100 and gate stacks 120 on top thereof, and subsequently etching the deposited layer, in a directional manner, to leave the spacer or spacer-suitable material only at areas adjacent to sidewalls of gate stacks 120. The deposition of spacer material is preferably performed in a conformal manner but non-conformal deposition of the dielectric material may be used as well. As being illustrated in FIG. 3B and FIG. 3C, after the directional etching, spacers 131 are formed surrounding the sidewalls of gate stacks 120.

According to one embodiment of the present invention, spacers 131 or the material used for making spacers 131 may be selected such that it will tolerate or withstand a pre-cleaning process that is normally performed before epitaxial silicon-growth, as being described below in more details.

FIGS. 4A-4C are demonstrative illustrations of perspective, top, and cross-sectional views respectively of a semiconductor structure during a process of manufacturing thereof, following the steps shown in FIG. 3, according to an embodiment of the present invention. Following the formation of spacers 131, embodiment of the present invention includes forming a sacrificial layer 141 covering fins 101-104 and gate stacks 120. The material of sacrificial layer 141 may be selected to be compatible with a high-temperature processing process, and may also be selected such that it provides high etch-selectivity to materials such as silicon, silicon-dioxide, and/or silicon-nitride. For example, a carbon based material that is compatible with high temperature processing may be used to form sacrificial layer 141, which covers oxide layer 100 and the structures on top thereof such as fins 101-104. According to one embodiment, the high-temperature process compatible material for sacrificial layer 141 may include, as non-limiting examples, amorphous carbon, amorphous carbon nitride, and/or polyimide. Other types of high-temperature process compatible materials may be used as well. Depending upon the type of material being used, sacrificial layer 141 may be formed through a spin-on process or through CVD based deposition process.

FIGS. 5A-5C are demonstrative illustrations of perspective, top, and cross-sectional views respectively of a semiconductor structure during a process of manufacturing thereof, following the steps shown in FIG. 4, according to an embodiment of the present invention. After the formation, sacrificial layer 141 may be patterned to create openings in strategic areas where further features, according to embodiment of the present invention, are to be formed. To create openings, depending upon the material used for sacrificial layer 141, the top surface of layer 141 may be optionally planarized first. For example, the top surface of a CVD deposited sacrificial layer 141 may be made planar through, for example, a chemical-mechanic-polishing (CMP) process or other planarization processes. Next, to pattern sacrificial layer 141, a hard mask layer may first be deposited on top of sacrificial layer 141 followed by a photo-resist layer. The photo-resist layer is then patterned through a standard lithographic process. The photo-resist mask may be formed to have a pattern which represents openings to be made in desired locations of sacrificial layer 141. More specifically, openings may be desired and therefore made in places where spacing between neighboring fins, such as between fin 102 and fin 103, is relatively limited and where electrical shorting between neighboring fins is likely to happen during a follow-up step of forming an epitaxial film.

The photo-resist pattern is then transferred to the hard mask layer underneath. Embodiment of the present invention then applies the hard mask layer in a directional etching process, to create openings, such as openings 151, 152, and 153 inside sacrificial layer 141 at selected locations as being described above. The directional etch process may be a reactive-ion-etching (RIE) process and may be adjusted to be highly selective to silicon (Si), silicon-nitride (SiN), silicon-oxide ($SiO_2$), and other materials in the hard mask layer and device structure. In other words, the RIE process may be tailored to be very effective particularly to carbon-based material of sacrificial layer 141 and significantly less effective and will etch very little to other materials in the device. As being illustrated in FIG. 5C which is a cross-sectional view taken at A-A', opening 152 is made through carbon-based sacrificial layer 141 and exposes at least a portion of top surface of oxide layer 100 underneath sacrificial layer 141.

FIGS. 6A-6C are demonstrative illustrations of perspective, top, and cross-sectional views respectively of a semiconductor structure during a process of manufacturing thereof, following the steps shown in FIG. 5, according to an embodiment of the present invention. Following the creation of openings 151-153 inside carbon-based sacrificial layer 141, dielectric material may be used to effectively fill up openings 151, 152, and 153, thereby creating barrier structures 161, 162, and 163 on top of oxide layer 100. More specifically, for example, dielectric material may first be deposited on top of sacrificial layer 141 and into openings 151-153. Subsequently, a CMP process may be used to remove excess of the dielectric material such as those on top of sacrificial layer 141 leaving only those in the openings of 151-153. The CMP process may stop at the carbon-based sacrificial layer 141.

According to one embodiment of the present invention, suitable material for making barrier structures 161-163 may include, for example, silicon-nitride (SiN) deposited through an atomic layer deposition (ALD) process performed at around 500 degree C.; hafnium-oxide (HfO$_2$) deposited through the ALD process performed at around 250~400 degree C.; and/or aluminum-oxide (Al$_2$O$_3$) deposited through the ALD process at around 250~400 degree C. The high-temperature process compatible sacrificial layer 141 enables the above process of forming barrier structures 161-163 at their respective high temperature.

FIGS. 7A-7C are demonstrative illustrations of perspective, top, and cross-sectional views respectively of a semiconductor structure during a process of manufacturing thereof, following the steps shown in FIG. 6, according to an embodiment of the present invention. After openings, such as openings 151-153, in carbon-based sacrificial layer 141 have been filled up with dielectric material, sacrificial layer 141 may be removed to expose underneath oxide layer 100, gate stacks 120, as well as fins 101-104. The removal of sacrificial layer 141 may be made through a combination of wet and dry etching techniques. For example, the removal of sacrificial layer 141 may be made by a similar process as being used in creating openings 151-153 as being illustrated in FIG. 5 which is selective to the materials of barrier structures 161-163. Moreover, any employed removal techniques that are used to remove sacrificial layer 141 are adjusted to be highly selective to materials of the device structure 300 other than the carbon-based sacrificial layer 141. For example, a dry etching process may be made highly selective to silicon (Si), silicon-oxide (SiO$_2$), and silicon-nitride (SiN).

Here, it is to be noted that barrier structures or barrier film 161-163 have been created, on top of oxide layer 100, in areas that are considered as critical to prevent shorting of neighboring fins. For example, barrier structure or barrier film 162 is formed between fins 102 and 103 to prevent electrical shorting of the two in a follow-up process.

FIGS. 8A-8C are demonstrative illustrations of perspective, top, and cross-sectional views respectively of a semiconductor structure during a process of manufacturing thereof, following the steps shown in FIG. 7, according to an embodiment of the present invention. After barrier structures 161-163 have been created, silicon-based epitaxial film growth may be performed to create epitaxial films 181, 182, 183, 184, 185, 186, 187, and 188 around fins 101-104. Epitaxial films 181-188 may be collectively a single epitaxial film or be part of a single epitaxial film, although they may be illustrated in FIG. 8 as being separated or isolated because silicon epitaxial film does not normally grow on top of oxide layer such as oxide layer 100 of substrate 109. Before performing epitaxial growth of the film or films, a pre-cleaning of substrate 109, in particular surfaces of fins 101-104 formed on top of oxide layer 100 of substrate 109 may be performed to remove possible contaminants and/or strange objects on the silicon surface of fins. The silicon-epitaxial films 181-188 may be used, for example, to lower external contact resistance by increasing silicon (Si) contact areas for forming silicide, and/or for forming local interconnects, for FinFET transistors 180. During the process of epitaxial growth, in one embodiment laterally grown epitaxial films 184 and 185, for example, may reach barrier structure 162 and be arrested by the presence of barrier structure 162. In another embodiment, epitaxial films 184 and 185 may grow laterally towards and may reach or not reach barrier structure 162. In any event, barrier structure 162 prevents or blocks fin 102 from contacting fin 103 through epitaxial films 184 and 185. For that reason, barrier structure 162 may also be referred to herein as growth stopper 162. As a result, potential electrical shorting between neighboring fins, and thus neighboring FETs, is prevented.

Figure 9B:
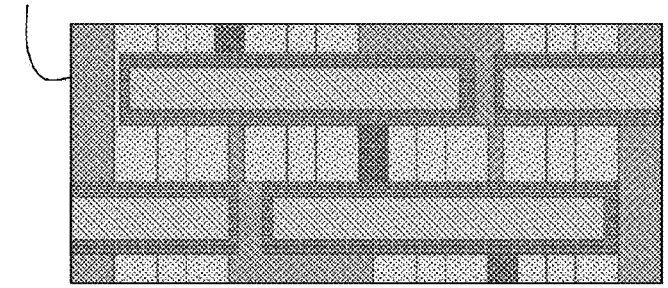
Figure 9A:
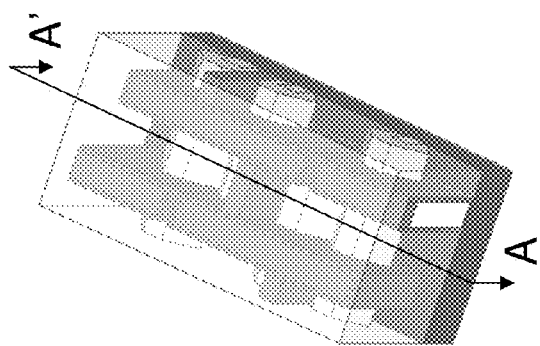

FIGS. 9A-9C are demonstrative illustrations of perspective, top, and cross-sectional views respectively of a semiconductor structure during a process of manufacturing thereof, following the steps shown in FIG. 8, according to an embodiment of the present invention. After growing epitaxial films 181-188, the rest steps of forming FinFET transistors 180 may be performed using known or future developed processes and/or techniques, Semiconductor structure 300 is then encapsulated in another dielectric material. For example, a dielectric material 191 may be deposited to cover oxide layer 100, fins 101-104 and the epitaxial films formed around the fins, gate stacks 120, and barrier structures or growth stoppers 161-163. Dielectric material 191 may include silicon-oxide (SiO$_2$), silicon-nitride (SiN), and/or any other materials suitable as an inter-layer-dielectric (ILD) layer.

Figure 10C:
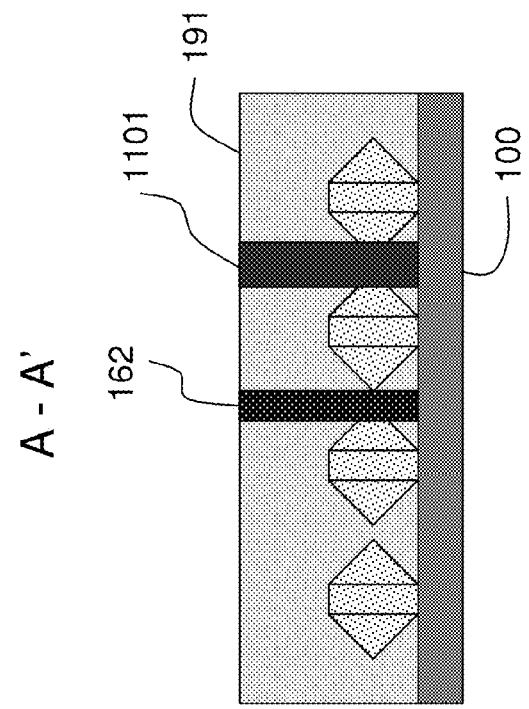
FIGS. 10A-10C are demonstrative illustrations of perspective, top, and cross-sectional views of a semiconductor structure during a process of manufacturing thereof, following the steps shown in FIG. 9, according to an embodiment of the present invention.
Figure 10B:
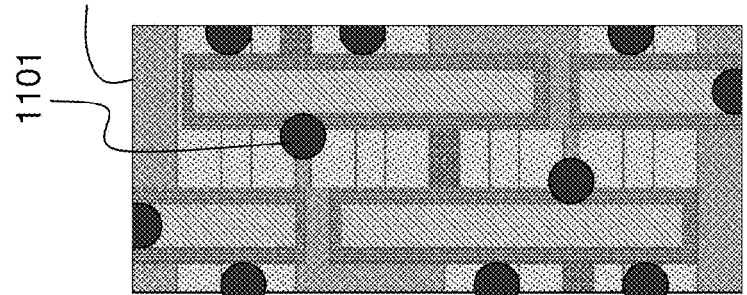
Figure 10A:
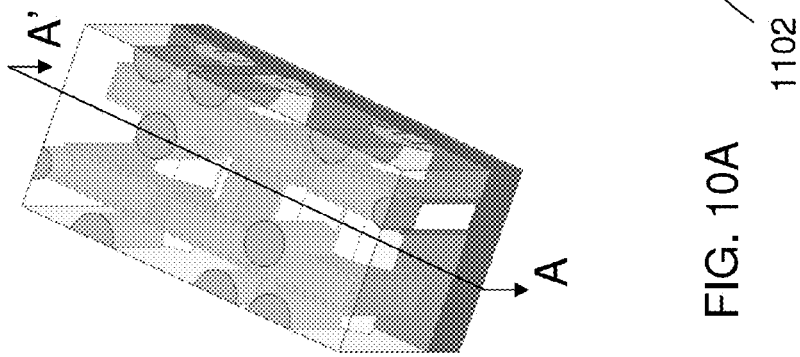

FIGS. 10A-10C are demonstrative illustrations of perspective, top, and cross-sectional views respectively of a semiconductor structure during a process of manufacturing thereof, following the steps shown in FIG. 9, according to an embodiment of the present invention. After covering oxide layer 100 and the device structure on top thereof with dielectric material 191, conductive contacts to gate electrodes and/or sources/drains of FinFET transistors 180 may be formed. The formation of contacts may be made through first creating contact openings in dielectric layer 191 to expose underneath gate stacks, as well as source/drain epitaxial films. The gate stacks and/or source/drain epitaxial films may optionally be silicided in a previous step or steps. Subsequently, openings in the dielectric layer 191 may be filled with one or more conductive materials such as, for example, aluminum (Al), copper (Cu), tungsten (W), titanium (Ti), tantalum (Ta), titanium-nitride (TiN), tantalum-nitride (TaN), or a combination of one or more the above or other suitable metal or doped semiconductor materials. The filling of openings may be performed through deposition and other known or future developed techniques.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:
1. A method comprising:
   forming a plurality of fins of a plurality of field-effect-transistors on a substrate;
   forming at least one barrier structure between a first and a second fin of said plurality of fins, said at least one barrier structure having a height measured from said substrate that is higher than that of said first and second fins; and growing an epitaxial film from said plurality of fins, said epitaxial film extending horizontally from sidewalls of at least said first and second fins and said barrier structure preventing said first and second fins from contacting each other through said epitaxial film.

2. The method of claim 1, wherein forming said at least one barrier structure comprises:

forming a sacrificial layer covering said plurality of fins;

creating an opening in said sacrificial layer, said opening situating between said first fin and said second fin and exposing said substrate whereupon said first and second fins are formed; and filling said opening with a dielectric material.

3. The method of claim 2, wherein said sacrificial layer comprises a carbon-based material that is compatible with high temperature processing process, said carbon-based material is either amorphous carbon or amorphous carbon-nitride.

4. The method of claim 2, wherein said sacrificial layer comprises polyimide that is compatible with high temperature processing process.

5. The method of claim 2, wherein filling said opening comprises depositing silicon-nitride in said opening through an atomic layer deposition (ALD) process performed at around 500 degree C., or depositing hafnium-oxide or aluminum-oxide in said opening through said ALD process at round 250 to 400 degree C.

6. The method of claim 2, further comprising, before growing said epitaxial film:

removing said sacrificial layer thereby exposing said plurality of fins underneath thereof and said barrier structure; and pre-cleaning said plurality of fins to remove contaminants and strange objects.

7. The method of claim 1, further comprising:

depositing a dielectric layer covering said epitaxial film and said barrier structure; and creating conductive contacts, said contacts contacting at least one of said epitaxial film and said plurality of fins, through said dielectric layer.

8. The method of claim 1, wherein said substrate is a silicon-on-insulator (SOI) substrate having a silicon layer on top of an oxide layer, and wherein forming said plurality of fins comprises etching said silicon layer into said plurality of fins situating on top of said oxide layer.

9. The method of claim 1, wherein said substrate is a silicon-on-insulator (SOI) substrate having a silicon layer on top of an oxide layer, and wherein forming said plurality of fins comprises etching said silicon layer into said plurality of fins situating on top of said oxide layer.

10. A method comprising:

forming a plurality of fins of a plurality of field-effect-transistors on a substrate;

covering said plurality of fins with a sacrificial layer;

forming at least one barrier structure inside said sacrificial layer between a first and a second fin of said plurality of fins; and growing an epitaxial film from said plurality of fins, said epitaxial film growing towards said barrier structure from sidewalls of said first and second fins.

11. The method of claim 10, wherein forming said at least one barrier structure comprises:

creating an opening in said sacrificial layer, said opening situating between said first fin and said second fin and exposing said substrate whereupon said first and second fins are formed; and depositing a dielectric material inside said opening forming said barrier structure.

12. The method of claim 11, wherein said sacrificial layer is made of a carbon-based material that is compatible with high temperature processing process, said carbon-based material is either amorphous carbon or amorphous carbon-nitride.

13. The method of claim 11, wherein said sacrificial layer is a polyimide layer that is compatible with high temperature processing process.

14. The method of claim 11, wherein depositing said dielectric material inside said opening comprises depositing silicon-nitride through an atomic layer deposition (ALD) process performed at around 500 degree C., or depositing hafnium-oxide through said ALD process at round 250 to 400 degree C., or depositing aluminum-oxide through said ALD process at round 250 to 400 degree C.

15. The method of claim 11, further comprising, before growing said epitaxial film:

removing said sacrificial layer exposing said plurality of fins underneath thereof and said barrier structure; and pre-cleaning said plurality of fins thereby removing contaminants at exposed surfaces of said plurality of fins.

16. The method of claim 10, further comprising:

depositing a dielectric layer covering said epitaxial film and said barrier structure; and creating conductive contacts, said contacts contacting at least one of said epitaxial film and said plurality of fins, through said dielectric layer.

17. A method comprising:

providing a silicon-on-insulator (SOI) substrate, said SOI substrate having a silicon layer on top of an oxide layer;

patterning said silicon layer of said SOI substrate into a plurality of fins of a plurality of fin-type field-effect-transistors (FinFETs);

forming at least one barrier structure between a first and a second fin of said plurality of fins, said at least one barrier structure having a height measured from said SOI substrate that is higher than that of said first and second fins; and growing an epitaxial film from said plurality of fins, said epitaxial film extending horizontally from sidewalls of at least said first and second fins, and said barrier structure blocking said first fin from reaching said second fin through said epitaxial film.

18. The method of claim 17, wherein forming said at least one barrier structure comprises:

forming a sacrificial layer covering said plurality of fins;

creating an opening in said sacrificial layer, said opening situating between said first fin and said second fin and exposing said substrate whereupon said first and second fins are formed; and filling said opening with a dielectric material.

19. The method of claim 18, wherein said sacrificial layer comprises a carbon-based material that is compatible with high temperature processing process, said carbon-based material is either amorphous carbon or amorphous carbon-nitride.

20. The method of claim 18, wherein said sacrificial layer comprises polyimide that is compatible with high temperature processing process.

* * * * *